United States Patent [19]

Jucker, deceased et al.

[11] 4,301,335

[45] Nov. 17, 1981

[54] VISUAL TELEPHONE OR OTHER ANNUCIATOR RINGING INDICATOR

[75] Inventors: Jules Jucker, deceased, late of Zürich, Switzerland; by Hedwig A. Jucker-Raths, heir; by Edith H. Benz-Jucker, heir, both of Züich, Switzerland; by Erich J. Jucker, heir, Herriliberg, Switzerland; by Christina U. Uhlemann-Jucker, heir, Reinach, Switzerland

[73] Assignee: Reichle & De Massari, Uster, Switzerland

[21] Appl. No.: 72,479

[22] Filed: Jul. 4, 1979

Related U.S. Application Data

[63] Continuation-in-part of Ser. No. 850,342, Nov. 10, 1977, abandoned.

[30] Foreign Application Priority Data

Apr. 29, 1977 [CH] Switzerland .................... 5397/77

[51] Int. Cl.³ ............................................. H04M 1/00
[52] U.S. Cl. ................................................. 179/84 L
[58] Field of Search ................ 179/84 R, 84 L, 84 T, 179/81 C; 340/371, 384 E

[56] References Cited

U.S. PATENT DOCUMENTS

| | | | |
|---|---|---|---|
| 2,608,614 | 8/1952 | Williams | 179/84 L |
| 3,819,873 | 6/1974 | Stockton et al. | 179/84 L |
| 4,066,848 | 1/1978 | Darwood | 179/84 R |

*Primary Examiner*—Joseph A. Popek
*Attorney, Agent, or Firm*—Frishauf, Holtz, Goodman & Woodward

[57] ABSTRACT

A ribbon of light with a bright spot moving thereacross is generated by a series of sequentially located indicator lamps or LED's, sequentially energized by a ring counter which, in turn, is enabled by a time-based decoding circuit. The time-based decoding circuit has applied thereto, preferably by a magnetic pick-up, sensed signals representative of the ringing current in a telephone network, and decodes when such ringing signals are received, rejecting, however, all other signals on the telephone line such as, for example, calling or dialing signals, stray noises pulses, or the like. Preferably, eight lamps are provided, each one flashing for ⅛ second, with a ring counter cycling rate of 1 second. The ring counter can have connected thereto one or more additional control lines to indicate signals on these additional control lines by cycling at a rate different from that due to the telephone ringing current to, for example, indicate when a doorbell is operated by providing, to an observer, a ribbon of light with a bright spot moving at half the rate when the telephone is ringing.

10 Claims, 1 Drawing Figure

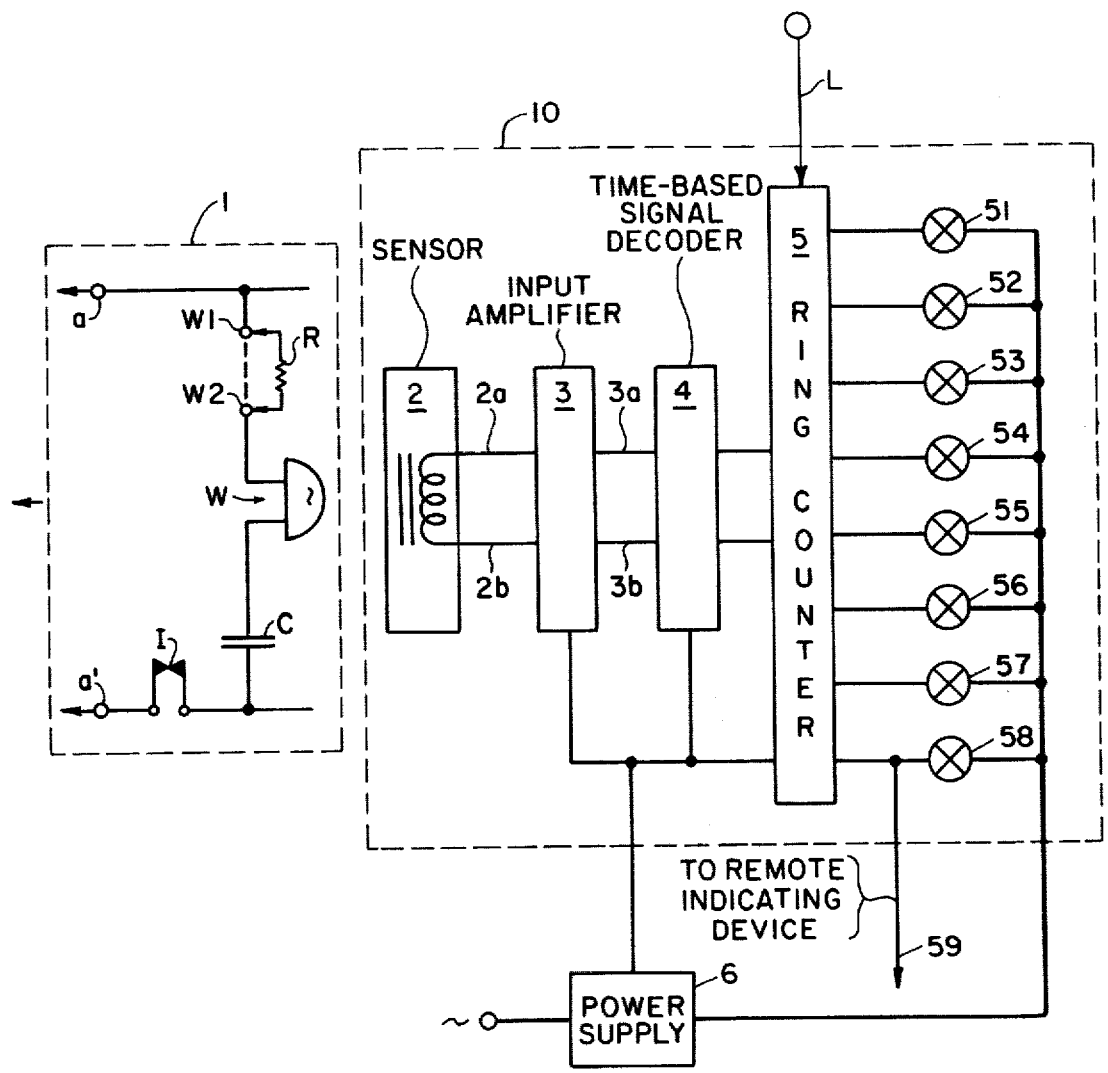

VISUAL TELEPHONE OR OTHER ANNUCIATOR RINGING INDICATOR

This is a Continuation-in-Part of my earlier application Ser. No. 850,342, filed Nov. 10, 1977, now abandoned.

The present invention relates to a telephone or other annunciator ringing indicator, and more particularly to a device which renders visible the presence of a changing magnetic field having a particular field change characteristic, typically the characteristic associated with standard telephone ringing signals.

BACKGROUND AND PRIOR ART

It is known to visualize the telephone call signal at the station of subscribers. This is particularly advantageous for deaf subscribers, for subscribers' stations located in noisy surroundings or, for example, in locations where numerous telephone receivers are located in a small area, for example in offices where closely located desks each are provided with telephones which ring frequently.

It has also been proposed to provide optical indication of signals which, usually, provide audible output, for example such as annunciators, doorbells, or other ringing devices.

THE INVENTION

It is an object to provide a device which will visualize signals, and particularly telephone signals, which are indicated to actuate a bell, and in which an alternating field will be induced, which is independent of the bell circuit itself so that it can be used, for example, in combination with a telephone system whose integrity must not be impaired, or as an extraneous additional attachment to other communication systems which may not be invaded.

Preferably, an individual discrete inductive sensor, galvanically separated from a telephone bell, is electromagnetically coupled to the ringing circuit to detect the alternating magnetic field upon operation of the bell, and to generate an output signal in response thereto, forming a sensed signal. Since numerous and different signals are present in the telephone system, however, the indicator apparatus includes a time-based decoding circuit coupled to an amplifier which amplifies the sensed signal to determine if the cyclical energization of the bell, as sensed by the sensor, corresponds to a predetermined time-based ON-OFF relationship, which is characteristic only of incoming ringing signals. Only if said correspondence is established will an enabling output signal be provided. The enabling output signal is connected to a ring counter which provides sequential output pulses, if enabled by the enabling output signals. The respective outputs of the ring counter are each connected to individual optical indicators, such as small incandescent lamps, light emitting diodes (LED's) and the like. When the ring counter is enabled, the lamps will light sequentially, thus providing not only a single flashing output but also a wandering or traveling ribbon of light, which is eminently suited to attract attention without, however, audibly disturbing other people close by.

In accordance with a feature of the invention, the ring counter can, additionally, be externally controlled and then operate at a count rate or count frequency which, preferably, is different from that at which it operates under control of the outputs from the enabling signal. This additional external control may, for example, be connected to an annunciator or other signaling indicator which differs from that of the telephone. The user, therefore, receives an output indication if the lights sequentially travel at a given rate, representative of a telephone call, or at a different rate, representative of another incoming signal, for example that of a doorbell or the like. It is also possible to utilize the other signal to override the counting feature and provide a single flashing output from all the lights, or a continuous ON condition of all the lights, depending on the specific internal connection of the ring counter.

In a preferred form of the invention, the lamps will light in the rhythm of stepping of the ring counter. If this stepping is rapid enough, the human eye may not be able to distinguish individual flashes of the individual lamps and, rather, may see a continuous light output. For example, eight adjacent lamps may be provided, each one lighting once within a 1-second interval, so that each lamp will be operated for $\frac{1}{8}$ second.

The time-based decoding circuit is capable of discriminating between the ringing signals in the telephone line and dialing signals by the subscriber himself, since the dialing signals are much shorter than the ringing signals. Likewise, noise signals and other signals which may be induced in the line due to stray transients are not transferred to the ring counter since only those signals which are specific to the ringing circuit of the telephone will provide an enabling output from the time-based decoding circuit.

DRAWING

The single FIGURE is a general schematic block diagram illustrating the present invention.

The bell coil W of a telephone subscriber's receiver 1 generate an alternating field at a given time rhythm, determined by the standard of the telephone network, such as a 1-second ringing current and 4-second interval. The telephone ringing circuit includes a capacitor C. The field from the bell W is transmitted to an induction coil 2 which is part of the device 10 in accordance with the present invention, but galvanically separate from the subscriber's receiver 1, and from the bell itself. The telephone circuit further includes a dial contactor I in the main line a, a' thereof.

The induced alternating current signal picked up in the pick-up coil 2, functioning as a sensor and providing a sensed output signal, if the bell W rings, is amplified in an input amplifier 3, which may be of any suitable design or construction. The amplified alternating current signals are connected from amplifier 3 by lines 3a, 3b to a circuit 4 which functions as a time-based signal selection circuit, where the time rhythm of the alternating current signals obtained from amplifier 3, that is, as sensed in sensor 2, is checked. Circuit 4, thus, functions essentially as a time-based decoding circuit and determines if the cyclical energization of the bell, as sensed by the sensor 2, corresponds to the predetermined time-based ON-OFF relationship determined by the telephone system and only if this correspondence is established, will circuit 4 provide an output signal. If the alternating current signals picked up by sensor 2 have the standard time rhythm defined by the telephone network, the time-based selection circuit or decoding circuit 4 generates an enabling output signal on lines 4a, 4b which switches the subsequently connected ring counter 5 ON.

Ring counter 5 has 8 output leads which are connected to indicator lamps 51-58. The output leads from the ring counter 5 will be sequentially enabled when an enabling signal from circuit 4 is obtained. This means that the lamps 51-58 will light in the rhythm determined by the ring counter 5. In the present embodiment, the time rhythm is selected in such a way that each one of the eight lamps will light once within one second. The frequency is selected in this way since, due to its response lag, the human eye will perceive the lamps 51-58 to be lit, essentially simultaneously. If, physically, the lamps 51-58 are positioned close to each other—as schematically indicated in the drawing—a ribbon of light will be generated with points of brightness traveling thereacross in accordance with the energization of the lamps 51-58.

A single connection 59 is connected to one lead 58 and is connected to a remote indicating device which may be a remote optical or acoustic indicator (not shown). This remote indicating device can be located, for example, physically removed from the device of the components 2-5. The connection 59 may, of course, be tapped on any one of the output leads of the ring counter, and if more than one connection is deired, various ones of the output leads can be tapped so as not to overload any particular single output. As the lamps 51-58 light up in the above-mentioned rhythm or cycle, the remote optical or acoustic indicating device connected to connection 59 will be activated only once during ⅛ of a cycle. In the present embodiment, the connection via line 59, which may be termed a pilot signal, will have a signal time of ⅛ second and a repeat once per second.

A power supply 6 is provided which supplies all the foregoing components with appropriate power. The power supply 6, preferably, is connected to the power mains which, as shown, may be a source of 220 V a-c, or to any other suitable power supply. It may also be a battery.

The circuit 4 functions as a time-based signal decoding circuit. It may be an integrated circuit, e.g. Motorola MC 14538. It reacts to the amplified alternating current pulses from the induction coil 2 and is so designed at the input side that it only generates output signals when the signals arrive in the above-indicated telephone ring time rhythm, for example of 1 second ON and 4 seconds OFF. If the alternating current signals from the induction coil 2 have a different time rhythm, for example pulses due to dailing interrupter I, the decoding circuit 4 does not generate an enabling output signal. Typically, the dialing pulses have a duty cycle within a range of ten pulses of equal length and pauses, occurring within a maximum of 2 seconds. In contrast, the duty cycle of the ringing pulses is 1 second ON and 4 seconds OFF. This vast difference in cyclical operation easily permits time-based decoding in the circuit 4. In a telephone subscriber's station, the time-based rhythm produced by operation of the dial generates not one but ten alternating current signals in the space of usually 1 second (maximally 2). Thus, circuit 4 makes a distinction between the undesired voltage signals when the subscriber wishes to obtain connection by generating dialing impulses from the actuating station, by means of interrupter 4, and the desired voltage signals which are to be decoded and indicated upon receipt of a telephone call.

Circuit 4 has another function. It holds the optical indication operative throughout the calling time of the calling station, that is, its output signal bridges the OFF intervals of 4 seconds of the telephone ringing signal. Thus, upon once decoding the ringing signal, it can then provide an enabling output signal, i.e. continue to energize ring counter 5 to cycle through its cycling time of 1 second even in the interval or OFF period of the ringing pulses.

A typical ring counter 5 is an integrated circuit (IC), for example the CMOS type 4017 (available from National Semiconductors, Motorola, or RCA). Such a ring counter is a combination of a binary counter and decoder. The ring counter ensures that the lamps 51-58, of which eight are shown in the drawing, but any other number can be used, will light in a continuous cycle with a predetermined repetition rate. Only one single lamp will be energized at a time, which has the advantage that the power supply 6 need be dimensioned only to supply power for a single lamp, thus can be a low power element, for example a battery. A further advantage of use of the ring counter is that an additional control line L can be connected thereto which, for example, can then be connected to an extraneous annunciator control, for example a doorbell, or the like. The connection L, when providing a signal, modifies the count cycling of the ring counter and provides an override enabling input from that otherwise obtainable from the decoding element 4. Thus, the lamps 51-58 will then light, but with a repetition frequency which is different from that when the ring counter 5 is enabled from the decoding circuit 4, indicative of a call being received on the telephone 1. When the ring counter 5 is energized from the line L, the observer of the sequentially positioned lamps 51-58 will receive a different image, for example a sequential flashing of the lamps at half the rate which otherwise is commanded upon ringing of the telephone 1.

The pick-up or sensor 2, amplifier 3, decoding circuit 4, ring counter 5, and the display formed by the lamps 51-58 need not all be in one single physical unit, as indicated by the broken lines in the figure; rather, for example, the sensor 2 and the amplifier 3 can be physically located in association with the telephone, and the connecting lines between the amplifier 3 and the remaining elements 4, 5 and 51-58—and the power supply 6, if desired—can be remotely located, for example in another room. Thus, for example, the telephone 1, with its audible ring, and the pick-up can be located in one position in a building, where noise does not ordinarily detract, and a silent, sequentially flashing indicator is formed by the display of lamps 51-58 and then remotely positioned, responding, however, only to ringing of the telephone and not if another user dials on a remote telephone.

The system can easily be modified for telephone systems in which integrity of the telephone network itself is not of primary importance, that is, in which the telephone network formed by lines a, a' can be invaded. A low resistor R, for example of from between 3 to 10 ohms, and, for example, of 0.5 W power dissipating capability, is connected between terminals W1 and W2 of the ringing circuit of the telephone, and the terminals W1, W2 are then connected in lieu of the output connections 2a, 2b from the sensor 2 or, respectively, 3a, 3b from the input amplifier 3, to control the decoding circuit 4 and the subsequent ring counter and the display. Plug-in connections which effect the connection of terminals W1, W2 instead of the respective connections 2a, 2b or 3a, 3b, while simultaneously placing resistor R in circuit, may be used.

Preferably, the lamps 51–58 are located in a housing which may fit under a standard portable telephone receiver, behind a screen or diffusion element. A colored cover strip which, preferably, is replaceable, can then be placed over the diffusion strip so that the color level of the visible output can be selected as desired by the user.

The system readily permits multiple connection. For example, the connection 59 can be used to energize or control another assembly formed by the ring counter 5 and another group of lamps 51–58 together with another power supply 6, the signal from line 59 then forming the enabling signal for the ring counter 5.

The decoder 4 can be constructed as a standard decoding element in IC form, for example the type 4538, Motorola, or equivalent RCA, which is a decoder with flip-flop circuits. The decoder differentiates the pulses derived from the sensor 2 and amplified by the amplifier 3, or derived from terminals W1, W2, respectively, by the frequency and the duty factor of the pulses, as explained above, by distinguishing the ringing signal—1 second ON and 4 seconds OFF—from noise signals or, for example, dialing signals due to operation of the dialing interrupter I, which normally has a duty cycle of ten pulses of equal length and pauses within a maximum of 2 seconds, usually 1 second.

Various changes and modifications may be made, and the interconnection of the system with a telephone network or with additional indicators, or to be controlled by additional annunciators or other input signals from line L, or additional lines similar to line L, may be suitably made within the scope of the inventive concept.

What is claimed is:

1. For combination with a telephone having a ringing circuit (a, W1, W2, W, C, a′) including a bell (W),
    a visual telephone ringing indicator generating a visible display in response to cyclical operation of the telephone bell, while rejecting electrical signals arising in said ringing circuit not destined for cyclical operation of said bell, comprising
    a time-based decoding circuit (4) coupled to the ringing circuit for determining if the cyclical energization of the bell corresponds to a predetermined time-based ON-OFF relationship representative only of telephone ringing signals and, only if said correspondence is established, providing an enabling output signal;
    a ring counter (5) providing sequential output pulses enabled by the enabling output signal from said time-based decoding circuit;
    optical indicating means (51–58) coupled to the output pulses of the ring counter for sequentially providing an optical indication upon enabling of the ring counter;
    and power supply means (6) for powering the time-based decoding circuit (4) and the ring counter (5) and providing output power matched to the number of optical indicating means enabled at any one time by said ring counter.

2. Indicator according to claim 1, wherein the ring counter has count output terminals;
    and the optical indicating means comprises a plurality of lamps respectively connected to the respective count output terminals of the ring counter and individually lighting, and positioned adjacent each other to provide, upon individual sequential energization, a traveling or moving ribbon of light.

3. Indicator according to claim 2, including a connection (59) leading to a remote optical or acoustic indicating device and connected to one of the output terminals from said ring counter connected to one of said indicating lamps.

4. Indicator according to claim 3, wherein the remote indicating device comprises a further device as set forth in claim 1, the time-based decoding circuit (4) thereof being enabled by said connection (59).

5. Indicator according to claim 1, wherein the time-based decoding circuit (4) provides a continuous enabling output signal independent of the ON timing of the energization of the bell circuit, to bridge the intervals of energization of the bell formed by the OFF portion of the sensed cyclical signal energizing said bell (W).

6. Indicator according to claim 1, further comprising an individual discrete inductive sensor (2) galvanically separate from said bell (W) and electromagnetically coupled to the ringing circuit for detecting the alternating magnetic field upon operation of said bell and generating a voltage change in response thereto, and forming a sensed signal;
    and an amplifier (3) coupled to the sensor (2) and amplifying the sensed signal, the output (3a, 3b) from the amplifier providing the input to the time-based decoding circuit (4).

7. Indicator according to claim 6, wherein the optical indicating means comprises a plurality of lamps respectively connected to respective count output terminals of the ring counter and individually lighting, and positioned adjacent each other to provide, upon individual sequential energization, a traveling or moving ribbon of light.

8. Indicator according to claim 1, further comprising an additional input line (L) connected to the ring counter (5) to energize the ring counter and to modify the cycling rate to cycle at a rate different from the cycling rate upon enabling or energization from the time-based decoding circuit, whereby the additional input line (L) can provide, upon furnishing a signal thereon, an output from the optical indicating means different from the output derived therefrom when the telephone ringing circuit is enabled by a ringing signal.

9. Indicator according to claim 8, further comprising an individual discrete inductive sensor (2) galvanically separate from said bell (W) and electromagnetically coupled to the ringing circuit for detecting the alternating magnetic field upon operation of said bell and generating a voltage change in response thereto, and forming a sensed signal;
    and an amplifier (3) coupled to the sensor (2) and amplifying the sensed signal, the output (3a, 3b) from the amplifier providing an input to the time-based decoding circuit (4).

10. Indicator according to claim 9, wherein the ring counter has count output terminals;
    and the optical indicating means comprises a plurality of lamps respectively connected to the respective count output terminals of the ring counter and individually lighting, and positioned adjacent each other to provide, upon individual sequential energization, a traveling or moving ribbon of light.

* * * * *